(12) United States Patent
Zeng et al.

(10) Patent No.: US 9,767,990 B2
(45) Date of Patent: *Sep. 19, 2017

(54) APPARATUS FOR TREATING A GAS IN A CONDUIT

(71) Applicant: APPLIED MATERIALS, INC., Santa Clara, CA (US)

(72) Inventors: Jibing Zeng, San Jose, CA (US); Brian T. West, San Jose, CA (US); Rongping Wang, Cupertino, CA (US); Manoj A. Gajendra, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/188,504

(22) Filed: Jun. 21, 2016

(65) Prior Publication Data

US 2016/0300692 A1    Oct. 13, 2016

Related U.S. Application Data

(63) Continuation of application No. 14/445,965, filed on Jul. 29, 2014, now Pat. No. 9,378,928.

(60) Provisional application No. 62/004,857, filed on May 29, 2014.

(51) Int. Cl.
*H01J 37/02* (2006.01)
*H01J 37/32* (2006.01)
(Continued)

(52) U.S. Cl.
CPC ..... *H01J 37/3211* (2013.01); *H01J 37/32467* (2013.01); *H01J 37/32522* (2013.01);
(Continued)

(58) Field of Classification Search
CPC ............ H01J 37/3211; H01J 37/32467; H01J 37/32522; H01J 37/32568; H01J 37/32807; H01J 37/32834
See application file for complete search history.

(56) References Cited

U.S. PATENT DOCUMENTS 3,875,068 A    4/1975 Mitzel
4,278,450 A    7/1981 Hurst et al.
(Continued)

FOREIGN PATENT DOCUMENTS

JP    2002-210330 A    7/2002

OTHER PUBLICATIONS

International Search Report and Written Opinion mailed Jul. 17, 2015 for PCT Application No. PCT/US2015/029068.

(Continued)

*Primary Examiner* — Don Le
(74) *Attorney, Agent, or Firm* — Moser Taboada; Alan Taboada

(57) ABSTRACT

Apparatus for treating a gas in a conduit of a substrate processing system are provided. In some embodiments, an apparatus for treating a gas in a conduit of a substrate processing system includes: a dielectric tube configured to be coupled to a conduit of a substrate processing system to allow a flow of gases through the dielectric tube, wherein the dielectric tube has a conical sidewall; and a radio frequency (RF) coil wound about an outer surface of the conical sidewall of the dielectric tube. In some embodiments, the RF coil is hollow and includes coolant fittings to couple the hollow RF coil to a coolant supply.

20 Claims, 3 Drawing Sheets

(51) Int. Cl.
*H05H 1/30* (2006.01)
*H05H 1/24* (2006.01)

(52) U.S. Cl.
CPC .. *H01J 37/32568* (2013.01); *H01J 37/32807* (2013.01); *H01J 37/32834* (2013.01); *H01J 37/32844* (2013.01); *H05H 1/2406* (2013.01); *H05H 1/30* (2013.01); H05H 2001/2468 (2013.01); Y02C 20/30 (2013.01)

(56) References Cited

U.S. PATENT DOCUMENTS

| | | | |
|---|---|---|---|
| 4,362,632 A | 12/1982 | Jacob | |
| 6,287,643 B1 | 9/2001 | Powell | |
| 6,657,173 B2 | 12/2003 | Flugstad et al. | |
| 8,475,673 B2 | 7/2013 | Edelberg | |
| 8,608,902 B2 | 12/2013 | Fukushima et al. | |
| 2008/0156264 A1* | 7/2008 | Fair | H01J 37/321 118/723 E |
| 2013/0284724 A1* | 10/2013 | Cox | H01J 37/32844 219/635 |
| 2015/0075718 A1 | 3/2015 | Fair | |

OTHER PUBLICATIONS

Search Report for Taiwan Invention Patent Application No. 104116295 dated Apr. 26, 2017.

\* cited by examiner

APPARATUS FOR TREATING A GAS IN A CONDUIT

CROSS-REFERENCE TO RELATED APPLICATIONS

This application is a continuation of co-pending U.S. patent application Ser. No. 14/445,965, filed Jul. 29, 2014, which claims benefit of U.S. provisional patent application Ser. No. 62/004,857, filed May 29, 2014. Each of the aforementioned related patent applications is herein incorporated by reference in their entirety.

FIELD

Embodiments of the present disclosure generally relate to substrate processing equipment.

BACKGROUND

Some gas treatment systems utilize radio frequency (RF) energy to ignite a plasma within a conduit to at least partially destroy or break down the gases flowing through the conduit. For example RF energy may be provided to a conductive coil disposed about a dielectric tube to facilitate ignition of gases flowing through the dielectric tube to form a plasma to treat the gases. However, the inner wall of the dielectric tube undesirably becomes eroded over time and needs to be replaced. The inventors have observed that replacement of the dielectric tube typically requires replacement of expensive components coupled to the dielectric tube.

Therefore, the inventors have provided an improved gas treatment system for treating a gas in a conduit that enables portions of the system to advantageously be reused rather than thrown away.

SUMMARY

Apparatus for treating a gas in a conduit of a substrate processing system are provided. In some embodiments, an apparatus for treating a gas in a conduit of a substrate processing system includes: a dielectric tube configured to be coupled to a conduit of a substrate processing system to allow a flow of gases through the dielectric tube, wherein the dielectric tube has a conical sidewall; and a radio frequency (RF) coil wound about an outer surface of the conical sidewall of the dielectric tube. In some embodiments, the RF coil is hollow and includes a first coolant fitting coupled to a first end of the RF coil and a second coolant fitting coupled to a second end of the RF coil.

In some embodiments, an apparatus for treating a gas in a conduit of a substrate processing system includes: a dielectric tube configured to be coupled to a conduit of a substrate processing system to allow a flow of gases through the dielectric tube, wherein the dielectric tube has a conical sidewall; a radio frequency (RF) coil wound about an outer surface of the conical sidewall of the dielectric tube, wherein the RF coil is hollow and includes a first coolant fitting coupled and a second coolant fitting coupled to the RF coil to facilitate flow of a coolant through the RF coil; one or more first terminals and one or more second terminals coupled to the RF coil to facilitate coupling RF power to the RF coil; a first end flange coupled to a first end of the dielectric tube; and a second end flange coupled to a second end of the dielectric tube, wherein each of the first and second end flanges are configured to couple the dielectric tube in-line with a conduit.

In some embodiments, a substrate processing system includes: a process chamber; an exhaust conduit coupled to the process chamber to allow a flow of exhaust gases from the process chamber; a vacuum pump coupled to the exhaust conduit to evacuate exhaust gases from the process chamber through the exhaust conduit; a dielectric tube coupled to the exhaust conduit to allow a flow of the exhaust gases through the dielectric tube, wherein the dielectric tube has a conical sidewall; and a radio frequency (RF) coil wound about an outer surface of the conical sidewall of the dielectric tube.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
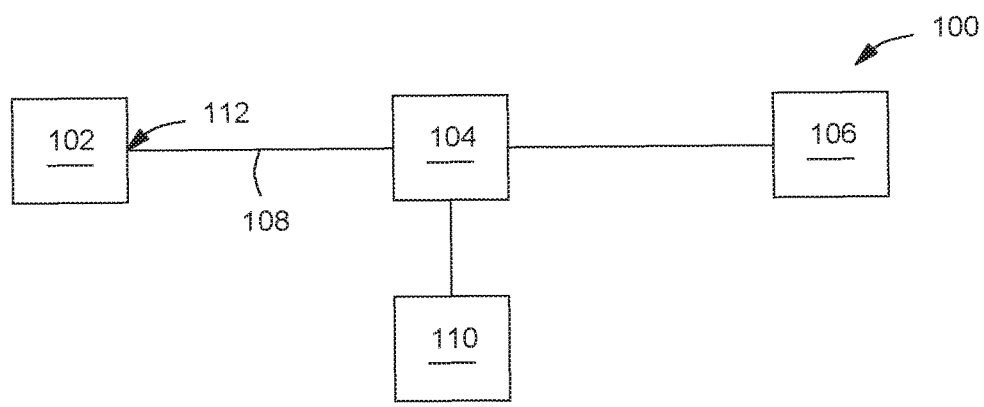
FIG. 1 depicts a processing system suitable for use with an apparatus for treating gas in a conduit in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for treating gas in a conduit are provided herein. Embodiments of the inventive apparatus may advantageously provide improved maintenance and replacement of components (e.g., a dielectric or ceramic tube) at a reduced cost as compared to conventionally utilized plasma driven gas treatment systems. Without limitation of the scope of the present disclosure, embodiments of the present disclosure are applicable to any of several in-line abatement or ionization chamber applications, for example, as described below with respect to FIG. 1.

FIG. 1 is a schematic view of a processing system 100 suitable for use with an apparatus for treating gas in a conduit in accordance with some embodiments of the present disclosure. The processing system 100 generally comprises a process chamber 102, an exhaust conduit (such as a foreline 108) coupled to the process chamber 102 to receive exhaust gases from the process chamber 102, and an apparatus for treating gas 104 coupled to the foreline 108.

The process chamber 102 may be any process chamber suitable to perform a process on a substrate. In some embodiments, the process chamber 102 may be part of a processing tool, for example a cluster tool, in line processing tool or the like. Non-limiting examples of such tools include substrate processing systems such as those used in semiconductor, display, solar, or light emitting diode (LED) manufacturing processes.

The foreline 108 is coupled to an exhaust port 112 of the process chamber 102 and facilitates the removal of exhaust gases from the process chamber 102. The exhaust gases may be any gases, for example such as process gases or byproduct gases that require removal from the process chamber 102. The foreline 108 may be coupled to a vacuum pump 106 or other suitable pumping apparatus to pump the exhaust gases from the process chamber 102 to appropriate downstream exhaust handling equipment (such as abatement equipment or the like). In some embodiments, the vacuum pump 106 may be a roughing pump or backing pump, such as a dry mechanical pump, or the like. In some embodiments, the vacuum pump 106 may have a variable pumping capacity with can be set at a desired level, for example, to control or provided additional control of pressure in the foreline 108.

The apparatus for treating gas 104 is configured for treating gas in a conduit and is disposed in-line with the foreline 108 to facilitate treatment or abatement of the exhaust gases from the process chamber 102. A power source 110, such as a radio frequency (RF) power source, is coupled to the apparatus for treating gas 104 to provide power to the apparatus for treating gas 104 to facilitate the plasma treatment of the exhaust gases. The power source 110 provides RF energy at a desired frequency and power sufficient to form a plasma within the apparatus for treating gas 104 such that the exhaust gas flowing through the apparatus for treating gas 104 may be treated with the plasma (e.g., at least partially broken down into one or more of ions, radicals, elements, smaller molecules, or the like).

In some illustrative embodiments, the power source 110 may be a variable frequency power source capable of providing RF energy at a range of frequencies. Embodiments of the present disclosure can use a low frequency (LF) or medium frequency (MF) band power supply to drive an inductively coupled plasma (ICP) discharge for gas abatement. LF to MF bipolar and RF power supplies can be used for driving, which advantageously will have a much smaller coil potential than higher frequency bands, such as high frequency (HF), very high frequency (VHF), etc. The smaller coil potential decreases capacitive plasma coupling and increase ICP power efficiency in the apparatus for treating gas 104. In addition, a lower potential on the RF coil can help reduce sputtering of inner surfaces of the apparatus for treating gas 104, thereby increasing lifetime of the apparatus for treating gas 104. In some illustrative embodiments, the power source 110 may provide about 2 to about 3 kW of RF energy at a frequency of about 1.9 to about 3.2 MHz.

Figure 2:
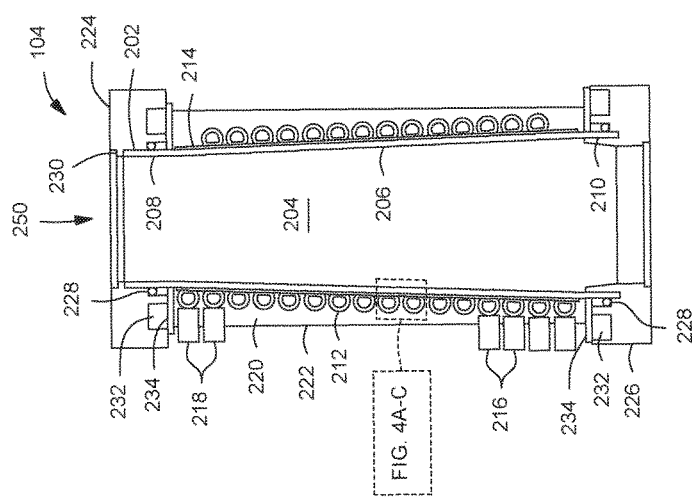
FIG. 2 depicts a schematic cross-sectional side view of an apparatus for treating gas in accordance with some embodiments of the present disclosure.

FIG. 2 depicts a schematic cross-sectional side view of an apparatus for treating gas 104 in accordance with some embodiments of the present disclosure. The apparatus for treating gas 104 generally includes a dielectric tube 202 having an inner volume 204 and an RF coil 212 disposed about the dielectric tube 202 to inductively couple RF energy to gases present in the inner volume 204 during use.

The dielectric tube 202 has a conical sidewall 206 that terminates with a straight end portion 208 at a first end of the dielectric tube 202 and a straight end portion 210 at a second end of the dielectric tube 202. The conical sidewall 206 may be disposed at an angle with respect to a central axis of the dielectric tube 202 of about 1 to about 5 degrees, such as about 2 degrees. The straight end portions 208, 210 facilitate coupling with conduits on either side of the dielectric tube 202 to facilitate flow of gases through the apparatus for treating gas 104.

The dielectric tube 202 may be fabricated from any dielectric material suitable to allow the transmission of RF power to an inner volume 234 of the dielectric tube 202 to facilitate ignition of a plasma and which can withstand processing conditions (e.g., temperature, plasma, chemistry, etc.). For example, non-limiting suitable materials include ceramics (such as alumina ($Al_2O_3$), sapphire, quartz, or the like.

The dielectric tube 202 may have any dimensions suitable to allow the flow of exhaust gases from a foreline and through the dielectric tube 202 for treatment. For example, in some embodiments, the dielectric tube 202 may have a length of about 6 to about 15 inches. In some embodiments, the dielectric tube 202 may have a diameter of about 1.5 to about 4 inches. The dielectric tube can have varying wall thickness suitable to provide mechanical strength and a desired RF coupling efficiency. A thicker sidewall will provide extended lifetime but with a lower power coupling efficiency. In some embodiments, the dielectric tube 202 may have a wall thickness of about 0.125 inches.

The RF coil 212 is wrapped about the outer surface of the conical sidewall 206 of the dielectric tube 202. The RF coil 212 may be wound about the outer surface of the dielectric tube 202 any number of times sufficient to provide uniform RF energy having a desired density to the inner volume 204 of the dielectric tube 202 to facilitate ignition of the exhaust gases within the dielectric tube 202 to form a plasma. For example, in some embodiments, the RF coil may have about 5 to about 15 turns. In some embodiments, each turn may be disposed about 0.25 to about 0.75 inches away from an adjacent turn. Spacers (not shown) may be used to maintain even pitch between turns of the RF coil 212. Embodiments of the present disclosure employ a spatially designed coil that emphasizes the plasma ignition function. Specifically, embodiments of the present disclosure emphasize the turn-to-turn potential drop of the RF col instead of the turn-to-ground voltage, which advantageously facilitates use of the reactor in larger diameter situations.

One or more first terminals 216 may be disposed at a first end of the RF coil 212 to facilitate coupling RF power to the RF coil 212. Four first terminals 216 are shown in FIG. 2. In embodiments where a plurality of first terminals 216 are provided, the terminals may be aligned vertically and placed on adjacent or different individual turns of the RF coil 212. One or more second terminals 218 may be disposed at a second end of the RF coil 212 to facilitate coupling RF power to the RF coil 212. Two second terminals 218 (e.g., a plurality of second terminals 218) are depicted in FIG. 2. For example, one of the one or more first terminals 216 may be coupled to an RF power source (e.g., power source 110 depicted in FIG. 1) and one of the one or more second terminals 218 may be coupled to ground to facilitate flow of RF energy through the RF coil 212. Ones of the plurality of first terminals 216 and plurality of second terminals 218 are located at different locations to provide flexibility to couple RF energy through a different number of turns of the RF coil 212, for example, for different applications having different plasma requirements.

Embodiments of the present disclosure may use push-pull driving method to deliver RF power into an inductively coupled plasma (ICP) glow discharge. Embodiments of the present disclosure further have the flexibility of balancing the potentials across the coil, and can reduce the peak potential to half, which advantageously preserves the ceramic reactor wall condition for a longer process time. Embodiments of the present disclosure can deliver power to a much larger space as compared to higher frequency systems. Thus, a much bigger space for gas abatement is provided. Molecules or species subject to abatement have much longer residence time inside a plasma, which enhances abatement efficiency.

To maintain spacing of the terms of the RF coil 212, a potting material 220 may be provided about the RF coil 212 and a lower portion of the one or more first terminals 216 and the one or more second terminals 218. In some embodiments, a cover 222 may be disposed around the potting material 220. The cover 222 may be a thin plastic material, such as polycarbonate, used as a form when potting the RF coil 212.

Figure 3:
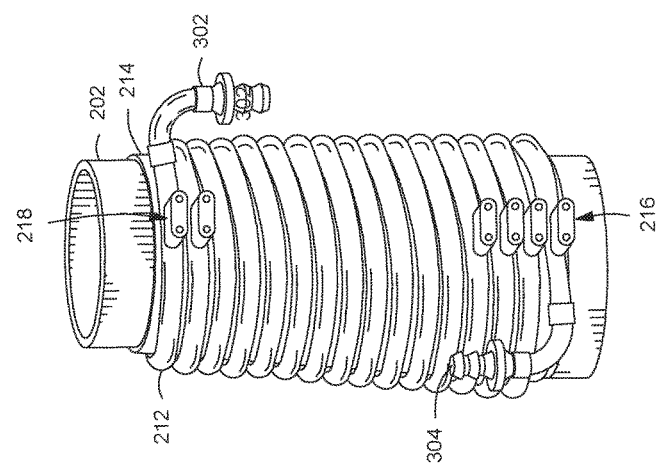
FIG. 3 depicts a partial perspective view of an apparatus for treating gas in accordance with some embodiments of the present disclosure.

The RF coil 212 is fabricated from a hollow tube of a suitable RF conductive and thermally conductive material. In some embodiments, the RF coil 212 is fabricated from copper tubing, such as #60 tubing, although other sizes may be used. A coolant may be provided to the hollow tube to facilitate removing heat from the RF coil 212 during operation. As shown in FIG. 3, a first coolant fitting 302 may be coupled to a first end of the RF coil 212 and a second coolant fitting 304 may be coupled to a second end of the RF coil 212 to facilitate coupling to a coolant source (not shown).

Figure 4A:
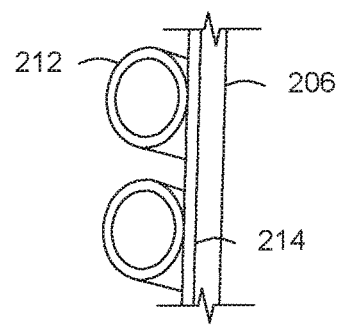
FIGS. 4A-C respectively depict various cross-sections of an RF coil of an apparatus for treating gas in accordance with some embodiments of the present disclosure.
Figure 4B:
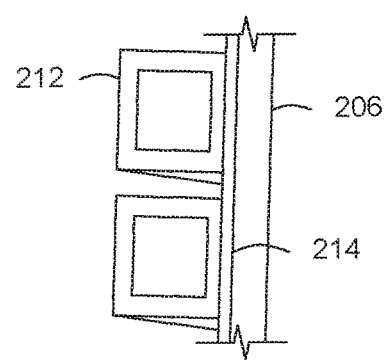
Figure 4C:
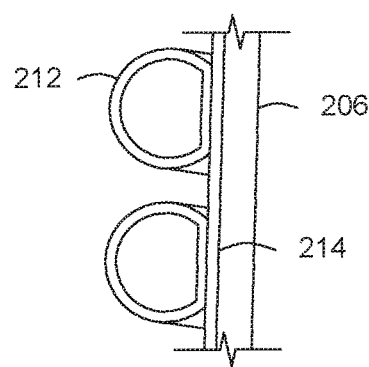

Returning to FIG. 2, the RF coil 212 may have one of various cross-sections. For example, as shown in FIG. 4A the RF coil 212 may have a circular cross-section. In some embodiments, as shown in FIG. 4B, the RF coil 212 may have a square cross-section. Providing a square cross-section enhances surface contact between the RF coil 212 and the conical sidewall 206 of the dielectric tube 202, which advantageously enhances thermal transfer between the dielectric tube 202 and the RF coil 212. In some embodiments, as shown in FIG. 4C, the RF coil 212 may have a flattened circular cross-section, wherein the flattened portion of the RF coil faces the dielectric tube 202. Providing a flattened circular cross-section advantageously provides enhanced surface contact between RF coil 212 and the dielectric tube 202 while utilizing a more commonly available and cheaper circular tube rather than more expensive square tubing. For example, in some embodiments, the RF coil may be made from round tubing which has been run through a rolling die to flatten one side so that when wrapped around the conically shaped dielectric tube 202 the contact surfaces between the two components are maximized, thus increasing the cooling efficiency of the coil/tube assembly.

Returning to FIG. 2, in some embodiments, a deformable layer 214 may be disposed between the RF coil 212 and the dielectric tube 202 to ensure more robust contact between RF coil 212 and the dielectric tube 202. The deformable layer 214 may be comprise any suitable material having a high thermal conductivity and RF transparency, such as silicon rubber or thermal grease.

A first end flange 224 and a second end flange 226 may be provided at respective ends of the dielectric tube 202 to facilitate coupling the apparatus for treating gas 104 in-line with a conduit (for example, such as the foreline 108 depicted in FIG. 1). A seal 228 may be provided between the respective first and second end flanges 224, 226 and the straight end portions 208, 210 of the dielectric tube 202. In some embodiments the seal 228 is an O-ring. In some embodiments, at least one of the first and second end flanges 224, 226 may be cooled. For example a coolant channel 232 may be provided in the first and second end flanges 224, 226 to facilitate circulating a coolant therethrough. In some embodiments, the coolant channel 232 may be formed in a side of the end flange with a 234 provided to seal the coolant channel 232. In such embodiments, a heat transfer fluid supply or recirculator (not shown) may be coupled to the coolant channels 232.

Figure 5:
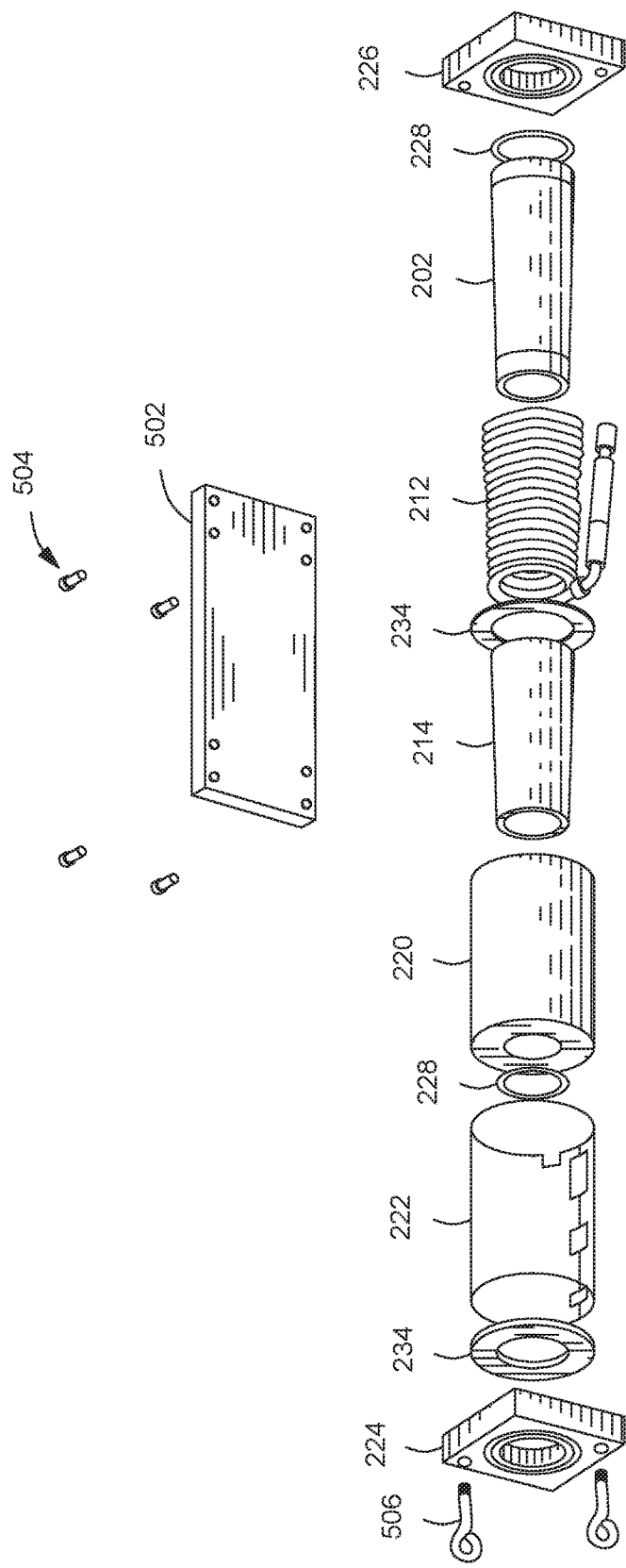
FIG. 5 depicts an exploded view of an apparatus for treating gas in accordance with some embodiments of the present disclosure.

FIG. 5 depicts an exploded view of the apparatus for treating a gas 104 in accordance with some embodiments of the present disclosure. Shown in FIG. 5, in some embodiments, the first end flange 224 may be threaded to receive eyebolts 506 to facilitate handling of the apparatus for treating a gas 104. Moreover, a support plate 502 may be provided and coupled to each of the first and second end flanges 224, 226 for example, via fasteners 504. The support plate 502 provide support for the apparatus for treating gas 104 to reduce physical stress on components of the apparatus for treating a gas 104.

In operation, effluent or exhaust gases from the process chamber 102 may be pumped through the foreline 108 and pass through the apparatus for treating gas 104. RF energy may be provided by the power source 110 to the RF coil 212 to form an inductive plasma within inner volume 204 of the apparatus for treating gas 104. The configuration of the apparatus for treating gas 104 advantageously may provide a longer service life as compared to conventional apparatus having capacitively coupled regions of plasma formation within the plasma treatment apparatus.

Thus, embodiments of the present disclosure use a conic dielectric reactor tube inserted into a conically shaped spiral radio frequency (RF) antenna/cooling coil. The RF coil, end plates, and wiring are all potted with a thermally conductive, electrically insulative compound (such as a silicone compound) to become a permanent assembly. Then the conic dielectric reactor core tube is inserted and end flanges with o-ring seals are installed. For refurbishment only, the ceramic core can be easily removed and replaced without damage to the RF coil assembly.

With a conical profile coil wrapping up a conical tube, when replacing the tube, by pressing along the axis of the conical reactor tube it is possible to disengage the tube from the coil with little effort as the conic surfaces will separate as soon as motion has begun (e.g., all surfaces become non-contact). Only the consumable chamber (the dielectric tube) needs to be replaced, and all other components can be reused.

While the foregoing is directed to embodiments of the present disclosure, other and further embodiments of the disclosure may be devised without departing from the basic scope thereof.

The invention claimed is:

1. An apparatus for treating a gas in a conduit of a substrate processing system, comprising:
    a dielectric tube configured to be coupled to a conduit of a substrate processing system to allow a flow of gases through the dielectric tube, wherein the dielectric tube has a conical sidewall; and
    a radio frequency (RF) coil wound about an outer surface of the conical sidewall of the dielectric tube.

2. The apparatus of claim 1, wherein the RF coil is hollow and includes a first coolant fitting and a second coolant fitting to facilitate flow of a coolant through the RF coil.

3. The apparatus of claim 1, wherein the dielectric tube is fabricated from alumina, sapphire, or quartz.

4. The apparatus of claim 1, further comprising:
a first end flange coupled to a first end of the dielectric tube; and
a second end flange coupled to a second end of the dielectric tube, wherein each of the first and second end flanges are configured to couple the dielectric tube in-line with a conduit.

5. The apparatus of claim 4, wherein the conical sidewall of the dielectric tube terminates with a straight end portion at the first end of the dielectric tube and a straight end portion at the second end of the dielectric tube, and wherein the first and second end flanges are coupled to the dielectric tube at the straight end portions.

6. The apparatus of claim 4, wherein at least one of the first and second end flanges further comprise a coolant channel to facilitate circulating a coolant through the at least one of the first and second end flanges.

7. The apparatus of claim 1, further comprising:
a deformable layer disposed between the RF coil and the dielectric tube to enhance contact between the RF coil and the dielectric tube.

8. The apparatus of claim 7, wherein the deformable layer comprises silicon rubber or thermal grease.

9. The apparatus of claim 1, wherein the RF coil has a flattened circular cross-section, and wherein a flattened portion of the RF coil is disposed facing the dielectric tube.

10. The apparatus of claim 1, further comprising:
one or more first terminals coupled to the RF coil and one or more second terminals coupled to the RF coil to facilitate coupling RF power to the RF coil.

11. The apparatus of claim 10, wherein the one or more first terminals comprise a plurality of first terminals, wherein the one or more second terminals comprise a plurality of second terminals, and wherein ones of the plurality of first terminals and the plurality of second terminals are located at different locations along the RF coil to facilitate coupling RF energy through a different number of turns of the RF coil.

12. The apparatus of claim 1, further comprising:
an RF power source coupled to a first end of the RF coil to provide RF power to the RF coil.

13. An apparatus for treating a gas in a conduit of a substrate processing system, comprising:
a dielectric tube configured to be coupled to a conduit of a substrate processing system to allow a flow of gases through the dielectric tube, wherein the dielectric tube has a conical sidewall;
a radio frequency (RF) coil wound about an outer surface of the conical sidewall of the dielectric tube, wherein the RF coil is hollow and includes a first coolant fitting coupled and a second coolant fitting coupled to the RF coil to facilitate flow of a coolant through the RF coil;
one or more first terminals and one or more second terminals coupled to the RF coil to facilitate coupling RF power to the RF coil;
a first end flange coupled to a first end of the dielectric tube; and
a second end flange coupled to a second end of the dielectric tube, wherein each of the first and second end flanges are configured to couple the dielectric tube in-line with a conduit.

14. The apparatus of claim 13, further comprising:
a deformable layer disposed between the RF coil and the dielectric tube to enhance contact between the RF coil and the dielectric tube, wherein the deformable layer comprises silicon rubber or thermal grease.

15. The apparatus of claim 13, wherein the RF coil has a flattened circular cross-section, and wherein a flattened portion of the RF coil is disposed facing the dielectric tube.

16. The apparatus of claim 13, wherein the one or more first terminals comprise a plurality of first terminals, wherein the one or more second terminals comprise a plurality of second terminals, and wherein ones of the plurality of first terminals and the plurality of second terminals are located at different locations along the RF coil to facilitate coupling RF energy through a different number of turns of the RF coil.

17. A substrate processing system, comprising:
a process chamber;
an exhaust conduit coupled to the process chamber to allow a flow of exhaust gases from the process chamber;
a vacuum pump coupled to the exhaust conduit to evacuate exhaust gases from the process chamber through the exhaust conduit;
a dielectric tube coupled to the exhaust conduit to allow a flow of the exhaust gases through the dielectric tube, wherein the dielectric tube has a conical sidewall; and
a radio frequency (RF) coil wound about an outer surface of the conical sidewall of the dielectric tube.

18. The substrate processing system of claim 17, wherein the exhaust conduit is a foreline.

19. The substrate processing system of claim 17, wherein the dielectric tube is disposed between the process chamber and the vacuum pump.

20. The substrate processing system of claim 17, further comprising:
an RF power source coupled to a first end of the RF coil to provide RF power to the RF coil.

* * * * *